United States Patent [19]

Golyanov et al.

[11] 4,049,533
[45] Sept. 20, 1977

[54] DEVICE FOR PRODUCING COATINGS BY MEANS OF ION SPUTTERING

[76] Inventors: Vyacheslav Mikhailovich Golyanov, ulitsa Rogova, 2, kv. 163; Alek Platonovich Demidov, ulitsa Rogova, 3, kv. 8, both of Moscow, U.S.S.R.

[21] Appl. No.: 611,918
[22] Filed: Sept. 10, 1975
[51] Int. Cl.² .............................................. C23C 15/00
[52] U.S. Cl. .................................................. 204/298
[58] Field of Search ............................... 204/192, 298

[56] References Cited

U.S. PATENT DOCUMENTS

| 3,458,426 | 7/1969 | Rausch et al. | 204/298 |
| 3,475,315 | 10/1969 | Moseson | 204/298 |
| 3,594,301 | 7/1971 | Bruch | 204/298 |
| 3,840,451 | 10/1974 | Golyanov et al. | 204/192 |

FOREIGN PATENT DOCUMENTS

| 2,125,936 | 12/1972 | Germany | 204/298 |

Primary Examiner—John H. Mack
Assistant Examiner—Aaron Weisstuch
Attorney, Agent, or Firm—Holman & Stern

[57] ABSTRACT

A device intended for producing single-layer coatings or films, for example, artificial diamond coatings or films, as well as multilayer or sandwich coatings. The device comprises a plurality of vacuum discharge chambers and at least two pairs of cathodes arranged in each of the chambers. Each pair of cathodes is provided with an anode which is disposed equidistantly from the cathodes forming each respective pair, the anodes of all the pairs of cathodes being arranged in one plane, whereas the cathodes in all the pairs are arranged in two planes that are parallel to the plane in which the anodes are arranged. Articles to be coated are arranged at the point of convergence of atomic beams of the cathode substance being sputtered. Each chamber is provided with a magnetic field source of its own. There is a vacuum evacuation system for all the chambers.

14 Claims, 8 Drawing Figures

DEVICE FOR PRODUCING COATINGS BY MEANS OF ION SPUTTERING

BACKGROUND OF THE INVENTION

The invention relates to improving coating devices, in particular, to improving a device for producing coatings by means of ion sputtering of substances in an ionized gas atmosphere. The invention is applicable for producing artificial diamond film coatings, as well as multilayer or sandwich coatings.

The present invention is an improvement of an earlier invention disclosed in U.S. Pat. No. 3,840,451.

According to the previous invention, in a vacuum chamber containing an ionized inert gas there are simultaneously sputtered two graphite cathodes. The sputtering is effected by electric discharge ions. Atoms of carbon that are released in the course of sputtering are deposited on a solid substrate.

There are known different types of devices for coating articles by means of ion sputtering of substances in ionized gas contained in a closed vessel. Such devices employ different sputtering systems, including diode, triode, and tetrode systems. There are also known devices with an autonomous ion source and what is referred to as pinpoint ion sputtering devices.

The diode-type devices are the simplest and cheapest. Such devices comprise a vacuum chamber, wherein there are arranged a cathode and an anode. An article to be coated is mounted on the anode. The device is provided with a vacuum evacuation system, an inert gas supply system, and a power supply system. The vacuum chamber is first evacuated and then filled with an inert gas. Voltage applied between the anode and cathode brings about a gas discharge, whereby a plasma is produced. The plasma consists of electrons, ions, and atoms of the inert gas, as well as of ions, molecules and atoms of residual gases of the vacuum system ($N_2$, $O_2$, $H_2O$, $CO_2$, $C_nH_m$, etc.). Under the action of the electric field, positive ions of the inert and residual gases bombard the cathode. The cathode is sputtered and emits electrons and neutral atoms of the cathode substance whose energy reaches several tens of electron-volts. Neutral atoms of the cathode substance are deposited on the article being coated, which serves as a substrate, in the form of a thin film.

Diode-type devices are disadvantageous in that they must operate at a comparatively high inert gas pressure (about $10^{-2}$ torrs), because at lower pressures such systems either fail to produce a gas discharge or produce an unstable discharge. As a result, neutral atoms of the cathode substance are dispersed and lose their energy on the way from the cathode to the substrate due to numerous collisions with inert and residual gas particles. The resultant coating (film) lacks density and durability and contains impurities. Another disadvantage of such devices resides in the constant bombardment of the freshly deposited coating by the plasma ions and electrons. This, too, affects the coating structure and accounts for lack of density and durability of the coating and a high impurity content therein.

Triode and tetrode devices differ from diode-type devices in that they include a thermionic cathode which is a source of thermoelectrons and is used to forcefully maintain a gas discharge. In a triode system, thermoelectrons are made into a gas discharge plasma with the aid of an anode, whereto a positive potential is applied. The material being sputtered (the target) is mounted on a third electrode whose potential is negative with respect to the plasma. Articles to be coated are secured in a holder opposite the target. After the cathode is hot, and after applying an anode voltage and filling the discharge chamber with an inert gas whose pressure reaches $10^{-3}$ torrs, there is produced a gas discharge. If a negative potential of several hundreds of volts is applied to the target, intensive bombardment of the latter with positive plasma ions starts. The material of the target is sputtered and deposited on the articles being coated.

Tetrode-type devices differ from triode-type devices in the presence of a fourth electrode arranged close to the thermionic cathode, which electrode facilitates ionization of the gas discharge plasma and makes it possible to reduce the inert gas pressure in the course of operation to $(2 - 4) \times 10^{-4}$ torrs.

Triode and tetrode devices are disadvantageous in that the freshly deposited film is bombarded with electrons and ions of the plasma. In addition, the presence of the thermionic cathode in such devices makes it impossible to carry out reactive sputtering. Furthermore, the hot cathode is a source of additional impurities in the film.

Devices with an autonomous ion source comprise two chambers, an ionization chamber and a working chamber. The two chambers are separated by a diaphragm having a small orifice. The ionization chamber is filled with an inert gas. The pressure in this chamber may be considerably higher ($10^{-2}$ torrs) than that in the working chamber ($10^{-5}$ torrs). In the course of operation, in the ionization chamber there are produced charged particles which pass through the orifice in the diaphragm to the working chamber, are focused by an electric and external magnetic fields and bombard a target. The target is sputtered, so there is produced a single source of neutral atoms of the target's substance. Articles being coated are arranged normally with respect to the atomic beam emitted from the target.

Devices with an autonomous ion source provide for reactive sputtering by way of supplying a reactive gas (for example, oxygen or nitrogen) directly to the working chamber, which prevents the destruction of the thermionic cathode of the ionization chamber. This system, however, is by far more sophisticated than all the other systems and must, as a rule, be provided with a thermionic cathode which is a source of additional impurities in the coating. Also, devices with an autonomous ion source can only employ one target for sputtering.

Still another device for producing coatings in the form of thin films is referred to as a pinpoint ion sputtering device. The basic component of such a device is a discharge chamber which comprises a long cylinder-shaped anode. Arranged inside the anode are two cathodes. One of the cathodes is adapted for moving in two directions in the plane perpendicular to the anode axis. Articles to be coated are mounted on the outside of the anode. The coating material reaches the articles through holes made in the anode wall. In order to stabilize the temperature of the articles, they are enveloped by a copper screen. In order to degas the discharge chamber and the articles prior to the sputtering process, the chamber is suspended on a copper arm at whose end there is secured a container for a heater element. In the course of operation, the container is filled with a cooling agent and serves for cooling the discharge chamber. The discharge chamber and the copper screen are contained in a sealed glass cylinder-shaped housing, upon which there is mounted a solenoid to produce a longitudinal magnetic field. A spectroscopically pure inert gas is supplied directly to the discharge chamber. One of the anode orifices may be closed with a metal shutter controlled from the outside, which makes it possible to improve the purity of the coating and accurately measure doses of the sputtered material.

The device under review operates as follows. As the device is energized, between the two cathodes there is produced a gas discharge in the form of an incandescent plasma column. At the point of contact between the column and the movable cathode, the cathode material is sputtered. Through a hole in the anode the sputtered material is passed to the article being coated and is deposited thereon.

The advantages of this device include the absence of a hot cathode and the possibility to still further reduce the inert gas pressure, as compared to tetrode systems. In addition, the article being coated is located outside the discharge zone, which rules out bombardment of the article by plasma ions and electrons and improves the quality of the coating.

That notwithstanding, the device also has a number of disadvantages. The basic disadvantage is the fact that the coating (film) is produced by atoms arriving from only one pinpoint sputtering area, and that atoms are deposited on the article only on the side and, as a rule, at an angle of 90°. This often results in a loose and flimsy coating which has microcracks and micropores. Another disadvantage of the device in question resides in partial penetration into the atomic beam of atoms of residual gases and other impurities, which is due to the following factors:

release of gases from the uncooled cathodes which are heated in the course of sputtering;

release of gases from the anode and other components of the discharge chamber due to incomplete degassing of the device prior to the sputtering operation, and insufficient cooling in the course of operation;

release of gases from packings in the inert gas supply system, and the absence of means for purifying the inert gas before it is supplied to the discharge chamber and release of gases from rubber seals in immediate proximity to the discharge chamber.

In addition, the pinpoint ion sputtering device is disadvantageous in the it does not have any means for completely removing impurities from the surface of the article being coated (oxides, etc.) prior to the coating operation. The result is insufficient or unsatisfactory adhesion of the coating (film) to the article.

Pinpoint ion sputtering is also disadvantageous in its low efficiency, especially in producing multilayer or sandwich films. Other disadvantages of this type of device include the following:

insufficient purity of the material in a separate layer in producing multilayer coatings (films) and the absence of substrate heating means, considering that substrates have to be heated when producing monocrystalline or macro-crystalline coatings by means of epitaxy.

It is an object of the present invention to eliminate the above disadvantages.

SUMMARY OF THE INVENTION

It is another object of the present invention to provide a device for producing coatings by means of ion sputtering, wherein the ionized gas pressure in the discharge chambers is considerably reduced, and the cathodes in the chambers are arranged so as to ensure uniform deposition of the coating material onto the surface of articles being coated.

It is still another object of the present invention to provide an ion sputtering device which is highly efficient and produces dense, durable, uniform and maximally pure coatings (films) on articles of different materials and shapes.

It is yet another object of the present invention to provide a device for producing artificial diamond coatings on articles, as well as for producing artificial diamond films per se (i.e. without a substrate).

Another object of the invention is to provide a device for producing coatings (films) with a metastable structure (the crystal lattice) of a material possessing novel and hitherto unknown properties.

The next object of the invention is to provide a device for producing maximally thin anticorrosion protective coatings on articles intended for operation in an aggressive medium.

Also, it is an object of the present invention to provide a device for producing coatings (films) from a mixture of several compounds which are unmixable by conventional mixing techniques.

Finally, it is an object of the present invention to provide a device for producing multilayer or sandwich film structures.

The foregoing and other objects of the present invention are attained by providing a device for producing films by means of ion sputtering of substances in an ionized gas atmosphere, which device comprises a cooled vacuum discharge chamber with an anode arranged between a pair of cathodes, as well as a power supply system, a magnetic field source, a system for vacuum evacuation of the discharge chamber, and a system for supplying an inert gas to the discharge chamber. The discharge chamber has, in accordance with the invention, at least two pairs of cathodes, the geometric centers of the flat surfaces of the cathodes, subjected to sputtering, being equidistant from each other in each pair and being located in mutually perpendicular planes, each pair of cathodes having an anode of its own, with which anode is equidistant from the cathodes of the respective pair, the anodes of all the pairs of cathodes being arranged in one plane, so that an article being coated is arranged at the point of convergence and overlapping of atomic beams of the sputtered substance from all the cathodes.

The invention makes it possible to produce dense, durable, solid and maximally pure films, especially film coatings, on different articles.

The proposed device makes it possible to produce artificial diamond coatings on articles, as well as artificial diamond films per se.

The coatings or films produced with the aid of the proposed device may have the conventional stable structure (the conventional type of crystal lattice) and a metastable structure (a different type of crystal lattice) having novel and hetherto unknown properties.

The proposed device further makes it possible to produce extremely thin anticorrosion protective coatings on articles intended for operation in aggressive media.

The device of the present invention is inconvenient and reliable in operation. The entire film producing process is automated.

According to one of the preferred embodiments of the present invention, the geometric centers of the cathodes in the discharge chamber are located at four apexes of an imaginary octahedron, at each apex of the octahedron there being arranged a holder with an article to be coated.

The foregoing cathode arrangement provides for the simplest way of producing durable and uniform films or coatings on flat articles.

The device of the present invention may have several discharge chambers arranged coaxially one after another in a common sealed cover, and drive means for moving holders with articles secured in them along the line passing through the apexes of the imaginary octahedrons of all the discharge chambers. Between the articles and the cathodes, on the path of atomic beams of sputtered substance, converging towards the apexes of the imaginary octahedrons, there is arranged a stationary mask with apertures, the geometric center of each aperture being found on the line connecting the apexes of the respective imaginary octahedron.

The foregoing arrangement of the chambers makes it possible to produce multilayer or sandwich films from different materials.

It is highly expedient that at the inlet of the sealed cover there should be installed a cooled ion pump providing for differential pumping of active gases.

The above arrangement of the ion pump brings the pump as close to the discharge chambers as possible (without resorting to piping or valves), and makes it possible to effectively evacuate active gases from both the heated cover and the unheated housing. Besides, such an arrangement of the ion pump makes it possible to continuously purify the inert gas supplied to the discharge chambers.

It is expedient in some cases that at least one of the cathodes be made from a material different from the material of the other cathodes. This makes it possible to produce films from a mixture of several components, including substances that normally cannot be mixed (for example, gold and carbon).

According to another embodiment of the invention, the proposed device may include means for applying an electric potential to at least one pair of cathodes, the value of the potential differeing from that of potentials applied to the other pairs of cathodes.

The application of different electric potentials to different pairs of cathodes makes for differentiated adjustment of the sputtering rate of the materials of the cathode pairs in order to produce coatings of variable thickness, as well as to produce films of highly uniform thickness.

If the cathodes are made of materials having different cathode sputtering coefficients, the adjustment of sputtering rates of the cathode materials makes it possible to produce films from a mixture of several substances with a preselected concentration of these substances.

It is advisable that the device include means for applying a pulse voltage to at least one pair of cathodes. This makes it possible to produce films having predetermined compositions as a result of periodically applying voltage to one or several pairs of cathodes.

The cathodes in each pair, whereto pulse voltage is applied, may be made from materials having equal cathode sputtering coefficients and from materials having different cathode sputtering coefficients.

At least in one pair of cathodes, the planes of the surfaces being sputtered may be inclined at an equal angle toward the article being coated. This provides for the deposition of a maximum amount of the coating substance on the surface of the article. Such a cathode arrangement is therefore advantageous for coating the surfaces of three-dimensional articles (spherical, prism-shaped, etc.).

It is highly desirable that the anodes and the cathodes be cooled. The anodes in this case must be rigidly mounted on a coiled pipe containing a cooling agent, whereas the cathode holders must be arranged next to the coiled pipe and separated therefrom by thin insulators.

The cooling of the anodes and the cathodes with a cooling agent, for example, liquid nitrogen, reduces the release of gases from their surfaces, which, in turn, reduces the pollution of coatings (films) with admixtures of active gases.

According to still another preferred embodiment of the invention, the proposed device may include means for applying a negative potential to a holder with an article which serves as a cathode. The value of the potential is selected depending upon the substance being sputtered and the sputtering conditions. The application of a negative potential to the article is followed by ion sputtering of the article's substance; consequently, the article's surface is cleaned from dsorbed gases, oxides and other impurities.

BRIEF DESCRIPTION OF THE DRAWINGS

Other objects and advantages of the present invention will become more apparent from the following detailed description of the preferred embodiments thereof, taken in conjunction with the accompanying drawings, wherein.

DETAILED DESCRIPTION OF THE PREFERRED EMBODIMENT

Referring now to the attached drawings, the proposed device comprises an ion sputtering unit 1 (FIG. 1) and means 1' (FIG. 2) for controlling the unit 1.

The ion sputtering unit 1 (FIG. 1) comprises a detachable heated vacuum cover 2 and an unheated housing 3 rigidly mounted on a stationary frame (not shown).

Figure 1:
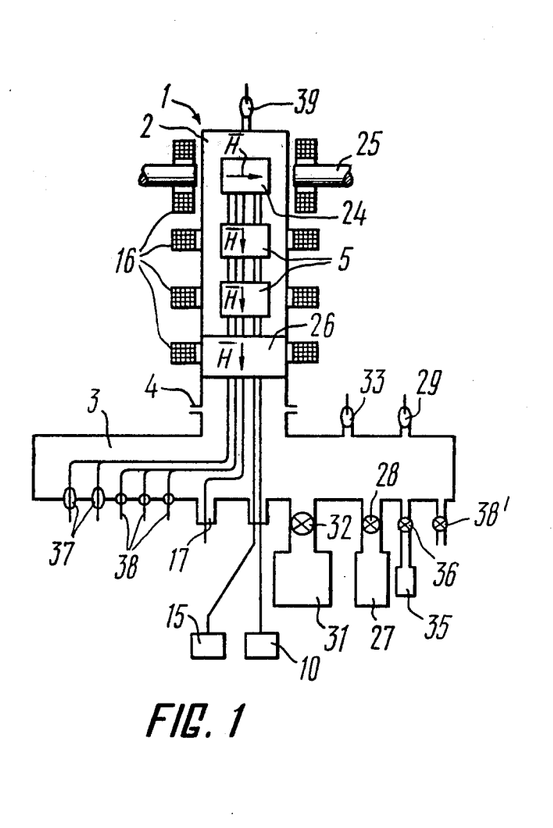
FIG. 1 is a schematic elevation view of an ion sputtering device in accordance with the invention.

The heated cover 2 is jointed to the housing 3 by means of a detachable metallic packing 4.

Arranged inside the cover 2 in sequential order are a plurality of discharge chambers 5 which may operate simultaneously and independently of one another.

The above arrangement of the chambers 5 makes it possible to produce both single-layer and multilayer or sandwich coatings.

Figure 3:
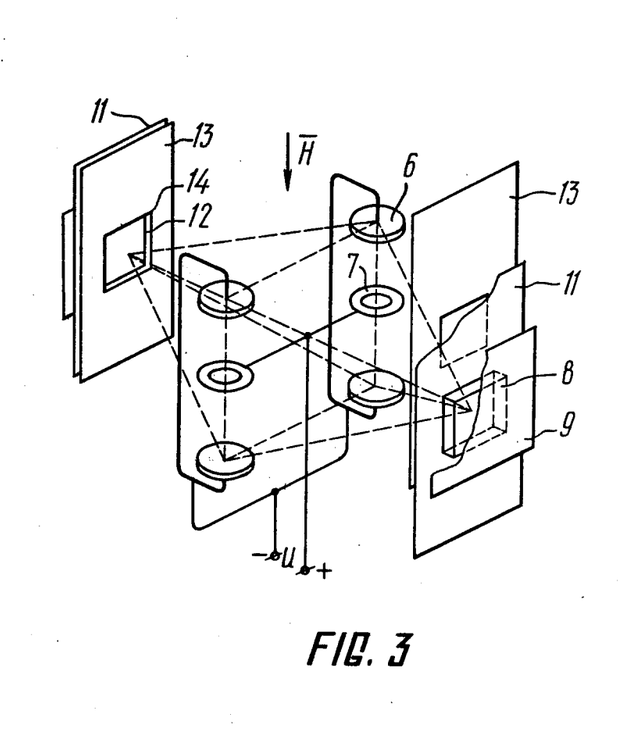
FIG. 3 shows an alternative embodiment of the discharge chamber.

FIG. 3 shows the discharge chamber 5 having two pairs of cooled cathodes 6 whose centers are found at four apexes of the lattice base of an imaginary octahedron. The sputterable surfaces of the cathodes 6 are found in two parallel planes.

Each pair of the cathodes 6 has a cooled anode 7. The anodes 7 are equidistant from the cathodes 6 and arranged in a plane parallel to the planes in which the cathodes 6 are arranged.

Articles 8 being coated are fixed in two movable holders 9.

In the course of operation, the centers of the articles 8 may be matched with the apexes of the imaginary octahedron lattice, at which atomic beams of the sputtered substance of all the cathodes 6 converge and overlap.

The articles 8 may travel from one discharge chamber 5 to another with the aid of a magnetic drive 10 mounted on the housing 3 (FIG. 1). In this case the holder 9 is joined by means of a rod (not shown) to a core (not shown) of a magnetically soft material. The core is movable in a tube (not shown) which is welded to the housing 3. An annular magnet (not shown) of a magnetically hard material is fitted over the tube and is movable therealong. Under the action of the magnetic field of the annular magnet, the core moves and transfers the holder 9 with the article 8.

Arranged between the cathodes 6 and the articles 8 are two stationary masks 11 having apertures 12 whose centers are found on the line which connects the apexes of the octahedron lattice. The shape of the apertures 12 may be different and depends upon the required shape of the coating.

Arranged between the cathodes 6 and the masks 11 are two movable metal shutters 13 having windows 14. The shutters 13 are provided with a magnetic drive 15 (FIG. 1).

The design of the magnetic drive 15 for moving the shutters 13 is similar to that of the magnetic drive 10 for moving the articles 8. The drive 15 is also mounted on the housing 3.

In order to produce a longitudinal magnetic field in the chamber 5, each discharge chamber 5 is provided with a solenoid 16 mounted on the outside of the cover 2.

The discharge chamber 5 under review is octahedron-shaped (FIG. 3) and used for coating flat articles.

Figure 4:
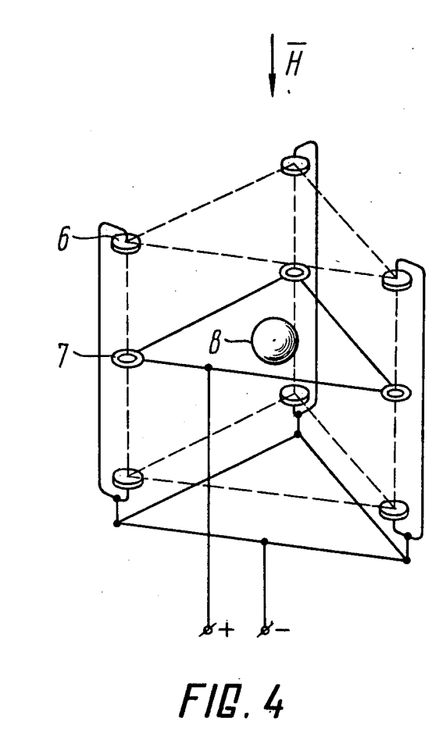
FIGS. 4 through 7 show alternative embodiments of the discharge chamber.
Figure 5:
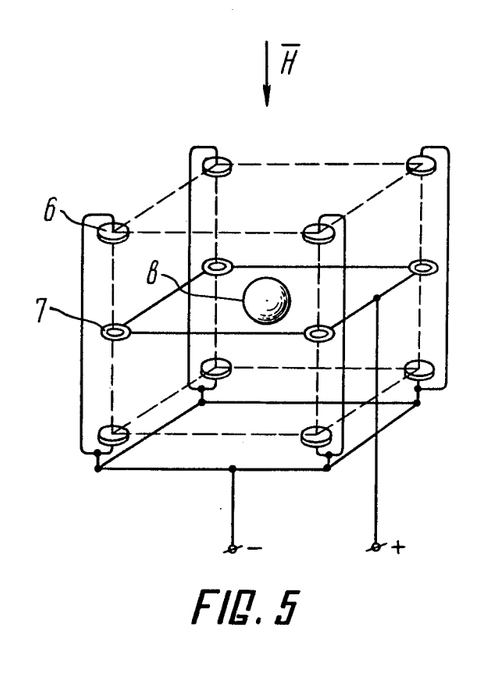
Figure 6:
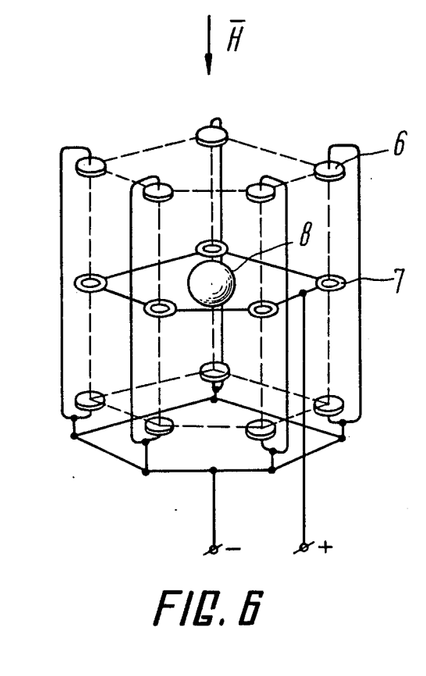
Figure 7:
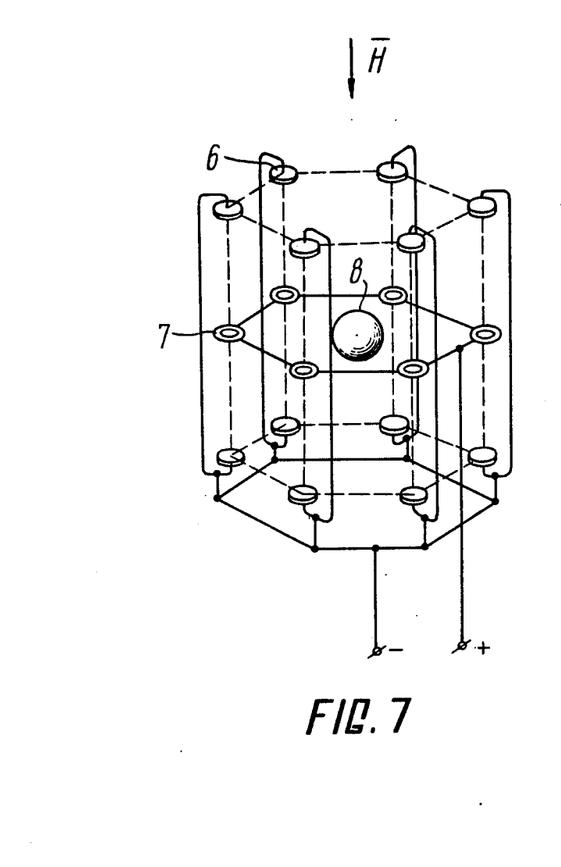

For coating the outer surfaces of three-dimensional articles, use is made of a discharge chamber 5, wherein the geometrical centers of the sputterable surfaces of the cathodes 6 are found at the apexes of an imaginary trihedral prism (FIG. 4), tetrahedral prism (FIG. 5), pentahedral prism (FIG. 6), hexahedral prism (FIG. 7) and other prisms.

Each pair of cathodes 6 in these prisms is provided with the anode 7 of its own. The anodes 7 are equidistant from the cthodes 6 and arranged in a plane parallel to the planes wherein the cathodes 6 are found.

In coating three-dimensional articles, the cathodes 6 may be turned so that the planes of their sputterable surfaces are inclined towards the article being coated. The result is a maximum amount of the sputtered substance deposited onto the surface of the article.

All the chambers 5 of the unit 1 have a common cooling system which serves to reduce the release of gases from the surfaces of all the components of the discharge chambers 5, as well as from the internal surface of the cover 2. This reduces the amount of active gas admixtures in the coatings (films).

The cathodes 6 and the anodes 7 are cooled by means of a coiled pipe 17 (FIG. 8) with a circulating cooling agent (for example, liquid nitrogen). The anodes 7 are mounted directly on the coiled pipe 17. The cathodes 6 are secured in holders 18 with the aid of elastic metal elements 19 and separated from the pipe by thin flat insulators 20 (for instance, of mica). The holders 18 abut against metal rings 21 welded to the coiled pipe 17.

Figure 8:
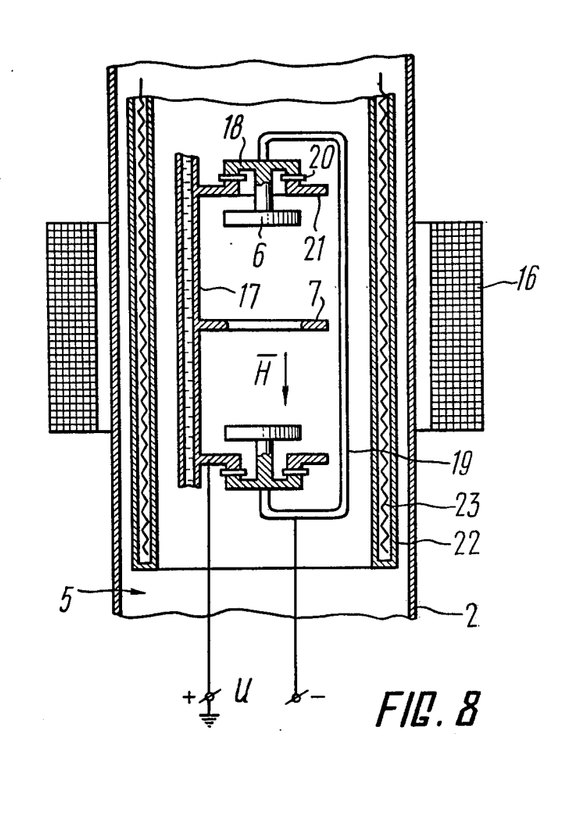
FIG. 8 is an elevational view of the discharge chamber in accordance with the invention.

The discharge chambers 5 are surrounded by a hollow screen 22 which in the course of the sputtering process is filled with a cooling agent (for example, liquid nitrogen).

Inside the hollow screen 22 there is a resistance heater 23 which is used to warm up all the components of the device housed inside the cover 2.

To purify the articles 8 from adsorbed gases, oxides and other impurities, inside the vacuum cover 2 there is also a chamber 24 (FIG. 1) for ionic cleaning of the articles 8. The function of the chamber 24 may be performed by a discharge chamber 5 without the cathodes 6. The function of the cathodes 6 is performed in this case by the articles 8 which are under a negative potential with respect to the anodes 7.

Arranged between the articles 8 in the chamber 24 are the anodes 7 which are equidistant from the surface of the articles 8. The solenoids 16 and a magnetic circuit 25 produce a magnetic field directed from the anodes 7 to the articles 8.

At the inlet of the vacuum cover 2 there are arranged one or more heated sputter-ion pumps 26 whose function may be performed by the discharge chambers 5, wherein the cathodes 6 are made from a material which effectively adsorbs molecules of residual gases. Such materials include, for example, titanium, zirconium, tantalum and other metals or combinations of these metals.

The heated sputter-ion pump 26 serves to pump off active gases released in the course of operation in the discharge chambers 5, and residual gases produced as a result of desorption in the unheated housing 3.

Also, the heated sputter-ion pump 26 is used to additionally purify the inert gas, which is supplied to the discharge chambers 5, from admixtures of active gases.

Figure 2:
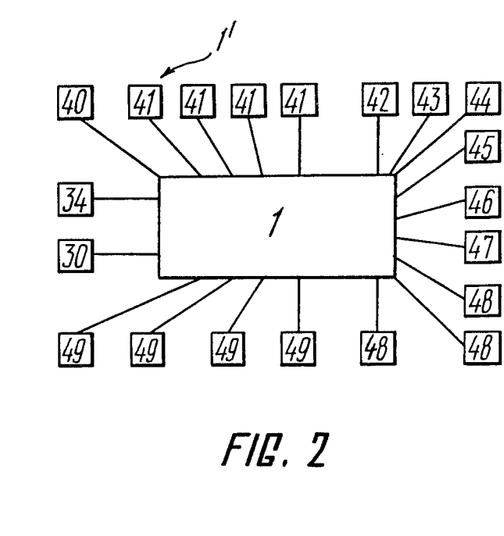
FIG. 2 is a block diagram of the device in accordance with the invention.

Mounted on the housing 3 is a sorption pump 27 with a valve 28 intended for preliminary evacuation of the unit 1 (to a pressure of $10^{-3}$ torrs). The pump 27 is a vessel containing a sorbent which is cooled in the course of operation with liquid nitrogen. The adsorbent may be zeolite, silica gel, etc. The pressure in the device is checked with the aid of a pressure gauge 29 of a thermocouple vacuum gauge 30 installed in the control means 1' (FIG. 2).

High-vacuum evacuation and degassing of the unit 1 are effected with the aid of a cold-cathode ion pump 31 with a valve 32. The latter two are mounted on the housing 3. In this case pressure inside the unit is checked with the aid of a pressure gauge 33 of an ionization vacuum gauge 34 installed in the control means 1'.

For continuous proportioned supply of a pure inert gas (for example, krypton) to the discharge chambers 5 through the operating heated sputter-ion pump 26, there are mounted on the housing 3 a glass cylinder 35 with a reserve of a pure inert gas, and an electromagnetic valve 36 with automatically regulates the supply of the inert gas to the cover 2.

In addition, on the housing 3 there are mounted high-voltage electric vacuum leads 37 to apply high voltage to the cathodes 6 of the chambers 5 and to the anode 7 of the ionic cleaning chamber 24. Also mounted on the housing 3 are low-voltage electric vacuum leads 38 for the connection of thermocouples (not shown) arranged inside the cover 2. Also, the leads 38 may serve to actuate the heaters of the articles 8 and thermocouples (not shown) which check the temperature the articles in producing monocrystalline coatings.

Also mounted on the housing 3 is a valve 38' which serves to fill the unit 1 with a dry gas (for example, nitrogen) after the end of operation.

Partial pressure of gaseous admixtures in the cover 2 is measured with the aid of an omegatron gauge 39 mounted on the cover 2, and a partial pressure gauge 40 installed in the control means 1' (FIG. 2).

The conrol means 1' includes several high-voltage discharge voltage sources 41 whose number corresponds to that of the discharge chambers. The sources 41 are capable of changing the output voltage within the range of 1 to 5 kV, and the load current within the limits of 0 to 10 milliamperes.

A discharge current stabilizer 42 is also incorporated in the control means 1'. The stabilizer 42 controls the electromagnetic valve 36 and regulates with the latter's aid the supply of a required amount of the inert gas to the cover 2, whereby the discharge current is stabilized in the chambers 5.

In addition, the control means 1' includes an exposure meter 43 for automatically controlling the shutters 13. The exposure time is set within the limits of 0 to 9,999 sec. The discreteness of exposure time settings is 0.1 sec. There is a digital exposure time display.

In producing multilayer or sandwich coatings, use is made of a layer counter 44 incorporated in the control means 1'. There is a digital layer count display.

In order to obtain a mixture of two or more compounds with a predetermined concentration of these compounds, the control means 1' includes a transistor pulse voltage regulator 45 which can adjust pulse duration if pulse voltage is supplied to one of several pairs of the cathodes 6.

This regulation ensures the sputtering of a required amount of the substance of the cathodes 6.

The control means 1' further includes a power supply unit 46 of the cold-cathode ion pump 31.

In addition, the control means 1' incorporates a power supply unit 47 of the resistance heater 23 which maintains a required temperature in the course of warming up the unit 1. In this case the temperature is checked with the aid of d.c. digital voltmeters 48 which measure the electromotive force at the ends of thermocouples (not shown) arranged in the cover 2.

The control means 1' still further includes power supply units 49 of the solenoids 16, the units 49 being adjustable rectifiers.

The device is powered with a three-phase current at a voltage of 22/380 V and a frequency of 50 Hz.

Prior to the start of operation, in each discharge chamber 5 there are installed four cathodes 6 of a material which is meant for coating (film). If the coating (film) is to be made of artificial diamond, the cathodes 6 are of graphite. The articles 8 are inserted into the holders 9. The apertures 12 of the masks 11 are closed by the shutters 13 driven by the magnetic drive 15. The vacuum cover 2 is put on the discharge chambers 5, the chamber 24 for ionic cleaning of the articles 8, and the heated sputter-ion pump 26. The cover 2 is then joined to the housing 3 by means of the metallic vacuum packing 4.

The device is then evacuated. At first, the evacuation is carried out by the sorption pump 27 to a pressure of about $10^{-3}$ torrs, after which the evacuation is carried out by the ion pump 31.

After the pressure has been brought down to $10^{-6}$ torrs, the resistance heater 23 is brought into play, and there starts the degassing of the inner volume of the cover 2.

The heating is accompanied by release of gases from the surfaces of all the components inside cover 2.

The degassing temperature is measured by thermocouples (not shown) arranged inside the cover 2, and the digital voltmeters 48.

At the end of the degassing operation, there is applied to the electrodes of the heated sputter-ion pump 26 high voltage from the discharge voltage source 41. A longitudinal magnetic field is produced by supplying voltage from the power supply unit 49 to the solenoid 16 arranged in the zone of the sputter-ion pump 26. In the sputter-ion pump 26 there is produced a discharge, and the substance of the cathodes 6 is sputtered. The sputtered cathode substance, for example, titanium, zirconium, tantalum, etc., adsorbs molecules of residual gases.

The device's cooling system is filled with a cooling agent, for example, liquid nitrogen.

After actuating the sputter-ion pump 26 and the cooling system, there is produced a maximum vacuum in the cover 2. The pressure, which is being measured by the gauge 33 of the ionization gauge 34, is brought to about $10^{-10}$ torrs. The partial pressures of all gas admixtures which are measured by the omegatron gauge 39 and the partial pressure gauge 40, are brought down to a minimum, for example, $$P_{H_2} < 10^{-10} \text{torrs};\ P_{N_2} < 10^{-10} \text{torrs};\ P_{H_2O} < 10^{-10} \text{torrs};$$
$$P_{O_2} < 10^{-10} \text{torrs}.$$

The ion pump 31 is then disconnected with the aid of the valve 32. The discharge current stabilizer 42 is brought into play, and an inert gas, for example, krypton, starts being supplied from the cylinder 35 and via the electromagnetic valve 36 to the device. The pressure is gradually raised, due to the supply of the inert gas, from $10^{-10}$ to $10^{-6}$ torrs. The discharge chambers 5 are then brought into action. Voltage is applied from the units 49 to the solenoids 16 of all the discharge chambers 5, so there is produced a longitudinal magnetic field in the discharge chambers 5. High voltage is applied to the electrodes of the discharge chambers 5 from the discharge voltage sources 41.

After the chambers 5 have been brought into operation, the following processes take place in each of these chambers.

Ionization of atoms of the inert gas takes place in the spacing between the cathodes 6. The electric field accelerates the freshly formed ions which are directed from the anodes 7 toward the cathodes 6 and bombard the latter.

The material of the cathodes 6 starts being sputtered. With an energy of ions of krypton, for instance, of 4 keV, the cathode sputtering coefficient of most materials amounts to a few atoms per one ion of krypton. Atomic beams knocked out from the surface of the cathodes 6 by ions of the inert gas consist, in the main, of neutral atoms, most knocked-out atoms having an energy of several electron-volts, which is in excess of the energy acquired by atoms in the course of thermal sputtering in a vacuum. At an inert gas pressure of $10^{-6}$ to $10^{-5}$ torrs in the chamber 5, the mean free path of individual atoms is considerably greater than the distance between the cathodes 6 and the article 8. Thus, in the course of operation of the chamber 5, each of the four cathodes 6 emits a divergent beam of comparatively fast-moving atoms.

Apart from neutral atoms of the substance of the cathodes 6, inert gas ions knock out from the surface of the cathodes 6 secondary electrons which, under the action of the electric and longitudinal magnetic fields of the solenoid 16, start moving along a spiral in the direction of magnetic lines, oscillate between the two cathodes 6, cause ionization of the inert gas, and maintain the gas discharge at a low inert gas pressure. Having brought about cathode sputtering, inert gas ions get stuck in the material of the cathode 6 and are neutralized. In the course of continued sputtering of the cathode 6, these ions are gradually released in the center of the cathode 6, but are held back at its side portions where the sputtering intensity is low. The consumption of the inert gas absorbed by the cathode 6 is made up for by continuous supply of fresh inert gas from the cylinder 35, the inert gas supply being automatically regulated by the electromagnetic valve 36 which is controlled by the discharge current stabilizer 42. The valve 36 is opened or closed, depending upon the magnitude of the gas discharge current which is proportional to the pressure in the chamber 5. After approximately 30 minutes of idle operations of each chamber 5, during which time the cathodes 6 and the anodes 7 are cleaned by the gas discharge, the device is ready for operation.

In order to produce a single-layer coating (film), the holder 9 with the article 8 is placed with the aid of the magnetic drive 10 at the center of the aperture 12 of the mask 11. The shutter 13 is so moved by the magnetic drive 15 that the window 14 is matched with the aperture 12 in the mask 11. As this takes place, the exposure meter 43 is actuated to measure the sputtering time.

The center of the aperture 12 of the mask 11 is located at the apex of the lattice of the imaginary octahedron, hence, in the course of operation there diverge in the center of the aperture 12 four atomic beams of fast-moving atoms of the substance of the cathodes 6 being sputtered. Each of the four beams is incident upon the plane of the articles 8 at an angle of approximately 45°. As a result, on the surface of the articles 8 there are practically no "shaded+ areas that are not exposed to the sputtered material of the cathodes 6. The resultant film on the articles 8 is dense, durable, and free from pores, cracks and other defects.

At the end of sputtering, the exposure meter 43 automatically closes the shutter 13.

In order to simultaneously produce single-layer coating on several articles 8, and in order to produce multilayer or sandwich coatings, use is made of a plurality of the discharge chambers 5 which can operate simultaneously and independently of one another.

In producing multilayer coatings, the materials of the cathodes 6 in each chamber 5 are different. The article 8 is successively coated in each discharge chamber 5. As this takes place, the article 8 travels from one chamber 5 to another with the aid of the magnetic drive 10. The article 8 is moved with the shutters 13 closed and without interrupting the sputtering process.

The number of coating layers on one article 8 is automatically recorded by the electonic layer counter 44.

In order to improve adhesion of the coating, the surfaces of the articles 8 must be cleaned from adsorbed gases, oxides, etc.

As it has been described above, preliminary cleaning of the surfaces of the article 8 is done in the course of warming up and degassing the device. As the article 8 is heated in the vacuum, its surface is cleaned from adsorbed gases.

If the cleaning is insufficient, the surfaces of the articles 8 are further cleaned by means of ion bombardment in the chamber 24 for ion cleaning of the articles 8.

For this purpose, the article 8 is arranged in the chamber 24 with the aid of the magnetic drive 10. A potential is then applied to the article 8, which is negative with respect to the anode 7, the magnitude of the potential being selected depending upon the material of the article 8 and the cleaning conditions. A magnetic field directed from the anode 7 to the article 8 is then produced by applying voltage to the solenoid 16 from the unit 49.

A discharge is produced between the anode 7 and the article 8. The result is sputtering of the substnace of the article 8. Thus the surface of the article 8 is cleaned from adsorbed gases, as well as oxides and other impurities.

In order to produce a coating (film) from a mixture of several substances with any ratio therebetween, at least one of the cathodes 6 in the discharge chamber 5 is made from a material different from the material of the other cathodes 6.

The required percentage between different components of the coating (film) is ensured by differentiating regulation of voltage applied to different pairs of the cathodes 6 from the autonomous discharge voltage sources 41. In this way one can adjust the sputtering rate of the materials of the cathode pairs and thus obtain coatings (films) from a mixture of several substances with a predetermined concentration of these substances.

If the cathodes 6 are made from the same material, such differentiating regulation of voltage applied to different pairs of the cathodes 6 makes it possible to produce coatings of a variable thickness on the articles 8, or produce coatings of a highly uniform thickness.

If the pulse voltage is applied to at least one pair of the cathodes 6 from the pulse voltage regulator 45, the percentage of the coating (film) components may be varied within broad limits by adjusting the duration and amplitude of the pulses.

In order to produce monocrystalline coatings (films), the article 8 in the form of a monocrystal, for example, a rock-salt crystal, is fixed in the holder 9 and is heated in the course of sputtering by a special resistance heater (not shown) to a required constant temperature. The temperature of the article is measured by a thermocouple (not shown).

At the end of operation, the conrol means de-energizes all the components of the device. The cooling system is also switched off. After all the elements inside the cover 2 reach the ambient temperature, a dry gas, for example, nitrogen, is supplied to the device with the aid of the valve 38'. This hinders the adsorption of active gases by the surfaces of all the elements in the cover 2 and thus reduces the time required to evacuate the device in order to prepare it for operation.

What is claimed is:

1. A device for producing films by means of ion sputtering of substances in an ionized gas atmosphere, comprising: a vacuum discharge chamber comprising cooling means, a magnetic field source means, a vacuum evacuation system and an inert gas supply means; at least two pairs of cathodes arranged in the chamber, the geometrical centers of flat sputterable surfaces of the cathodes being equally spaced from each other in each pair of cathodes and being found in parallel plane, each pair of cathodes having an anode equally spaced from the cathodes forming each respective pair, all anodes of all of the pairs of cathodes being located in a plane parallel to the planes in which the cathodes are found at least one holder adapted to hold articles to be coated arranged in the plane in which all of the anodes are located at the point of convergence and overlapping of atomic beams of sputtered material from all of the cathodes; and a power source of all of the cathodes and anodes of the chamber.

2. The device as claimed in claim 1, wherein at least one of the cathodes is adapted to comprise a material different from the material of the other cathodes.

3. The device as claimed in claim 2, further comprising a means for applying an electric potential to at least one pair of the cathodes, the magnitude of the potential being different from that of potentials applied to the other pairs of cathodes.

4. The device as claimed in claim 2, further comprising a means for applying a pulse voltage to at least one pair of the cathodes.

5. The device as claimed in claim 1, wherein in at least one pair of cathodes the planes of sputterable surfaces are inclined at an equal angle toward the article holder.

6. The device as claimed in claim 1, further comprising cooling means for the anodes and cathodes and a coiled pipe containing a cooling agent rigidly mounting the anodes, holders of the cathodes being pressed against the coiled pipe and separated therefrom by thin insulators.

7. The device as claimed in claim 1, wherein the geometrical centers of the cathodes are located at the apexes of an imaginary trihedral prism.

8. The device as claimed in claim 1, wherein the geometrical centers of the cathodes are located at the apexes of an imaginary tetrahedral prism.

9. The device as claimed in claim 1, wherein the geometrical centers of the cathodes are located at the apexes of an imaginary pentahedral prism.

10. The device as claimed in claim 1, wherein the geometrical centers of the cathodes are located at the apexes of an imaginary hexahedral prism.

11. A device for producing films by mans of ion sputtering of substances in an ionized gas atmosphere, comprising: a vacuum discharge chamber comprising cooling means, a magnetic field source means, a vacuum evacuation system and an inert gas supply means; two pairs of cathodes arranged in the chamber, the geometrical centers of flat sputterable surfaces of the cathodes being equally spaced from each other in each pair of cathodes and being found in parallel planes, each pair of cathodes having an anode equally spaced from the cathodes forming each respective pair, all anodes of all of the pairs of cathodes being located in a plane parallel to the planes in which the cathodes are found, the geometrical centers of the cathodes being found at four apexes of the lattice base of an imaginary octahedron; two holders, each of the holders adapted to hold an article located at each of the distal apexes of the octahedron opposite the lattice base; and a power source of all of the cathodes and anodes of the chamber.

12. The device as claimed in claim 11, wherein there are a plurality of discharge chambers arranged coaxially within a common sealed cover, and further comprising a drive means for moving holders adapted to hold articles to be coated along the line drawn through the distal apexes of the imaginary octahedrons of all the discharge chambers; and a stationary mask with apertures arranged between the article holders and the cathodes, on the path of atomic beams of sputtered substance, converging towards the distal apexes of the imaginary octahedrons, the geometric center of each of the apertures being found on the line connecting the distal apexes of the respective imaginary octahedron.

13. The device as claimed in claim 12, further comprising a cold-cathode ion pump installed at the inlet of the sealed cover and providing for differential pumping of active gases.

14. The device as claimed in claim 12, wherein at least one discharge chamber comprises ion cleaning means and further comprising a means for applying a negative potential to the article holders.

* * * * *